(12) United States Patent
Haiyang et al.

(10) Patent No.: US 11,735,429 B2
(45) Date of Patent: Aug. 22, 2023

(54) METHOD FOR FORMING SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Zhang Haiyang, Shanghai (CN); Liu Panpan, Shanghai (CN); Yang Chenxi, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 67 days.

(21) Appl. No.: 17/109,282

(22) Filed: Dec. 2, 2020

(65) Prior Publication Data
US 2021/0225656 A1    Jul. 22, 2021

(30) Foreign Application Priority Data
Jan. 17, 2020 (CN) .......................... 202010055421.X

(51) Int. Cl.
*H01L 21/3065* (2006.01)
*H01L 29/66* (2006.01)
*H01L 21/8234* (2006.01)

(52) U.S. Cl.
CPC .. *H01L 21/3065* (2013.01); *H01L 21/823412* (2013.01); *H01L 29/66795* (2013.01)

(58) Field of Classification Search
None
See application file for complete search history.

(56) References Cited

U.S. PATENT DOCUMENTS 10,629,451 B1\* 4/2020 Guo .................... H01L 29/6653
2016/0247680 A1\* 8/2016 O'Meara ......... H01L 21/823431
(Continued)

*Primary Examiner* — Roberts P Culbert
(74) *Attorney, Agent, or Firm* — Crowell & Moring, L.L.P.

(57) ABSTRACT

Methods for forming a semiconductor structure are provided. In one form, a method includes: providing a base; forming an initial pattern layer on the base; and performing atomic layer etching processing on a sidewall of the initial pattern layer one or more times to form a pattern layer, where the atomic layer etching processing includes: forming an organic layer on the sidewall of the initial pattern layer; and removing the organic layer. Generally, bond energy between an atom on an outermost surface of the sidewall of the initial pattern layer and an atom at an inner layer is less than bond energy between the atom at the inner layer. The organic layer usually includes an element that may react with the sidewall of the initial pattern layer, further reducing the bond energy between the atom on the outermost surface of the sidewall of the initial pattern layer and the atom at the inner layer. During removal of the organic layer, the atom on the outermost surface of the sidewall of the initial pattern layer may be peeled off. In this way, after a plurality of times of atomic layer etching processing, a protruding region on the sidewall of the initial pattern layer is flattened. Accordingly, the sidewall of the formed pattern layer has a relatively small roughness, so that electrical performance of the semiconductor structure can be improved.

18 Claims, 5 Drawing Sheets

(56) References Cited

U.S. PATENT DOCUMENTS

2017/0042010 A1* 2/2017 Liang ................. H01L 22/12
2018/0226260 A1* 8/2018 Romm ............... H01L 21/3081

* cited by examiner

METHOD FOR FORMING SEMICONDUCTOR STRUCTURE

RELATED APPLICATIONS

The present application claims priority to Chinese Patent Appln. No. 202010055421.X, filed Jan. 17, 2020, the entire disclosure of which is hereby incorporated by reference.

BACKGROUND

Technical Field

Embodiments of the present disclosure relate to the field of semiconductor manufacturing, and in particular, to a method for forming a semiconductor structure.

Related Art

In semiconductor manufacturing, with a development trend of large-scale integrated circuits, the integrated circuit has an increasingly small critical dimension. In order to adapt to the smaller critical dimension, a channel length of a metal-oxide-semiconductor field-effect transistor (MOSFET) is also increasingly reduced. As a channel length of a device becomes smaller, a distance between a source and a drain of the device also decreases. With this decrease, a channel control capability of a gate structure deteriorates, and it becomes increasing difficulty in pinching the channel off by a gate voltage. As a result, there is an increased possibility of subthreshold leakage, that is, the so-called short-channel effect (SCE).

In order to better adapt to the reduced critical dimension, semiconductor designs have gradually transitioned from a planar MOSFET to a three-dimensional transistor with higher efficacy, such as a fin field effect transistor (FinFET). In the FinFET, a gate structure may control an ultra-thin body (a fin) from at least two sides. Compared to the planar MOSFET, the gate structure has a stronger channel control capability and can suppress the short-channel effect well. Gate structure designs have also transitioned from an original polysilicon gate structure to a metal gate structure. A work function layer in the metal gate structure can adjust a threshold voltage of the semiconductor structure.

During operation of the semiconductor structure, the gate structure is configured to control turn-on and turn-off of the channel. An extending direction perpendicular to the fin is used as a lateral direction. A magnitude of a channel turn-on voltage is related to a lateral dimension of each part of a channel region in the fin.

SUMMARY

A problem to be addressed in embodiments and implementations of the present disclosure is to provide a method for forming a semiconductor structure to improve electrical performance of a device.

One form of the present disclosure provides a method for forming a semiconductor structure, including: providing a base; forming an initial pattern layer on the base; and performing atomic layer etching processing on a sidewall of the initial pattern layer one or more times to form a pattern layer, where a step of the atomic layer etching processing includes: forming an organic layer on the sidewall of the initial pattern layer; and removing the organic layer.

In some implementations, the organic layer is made of a material including at least one of chlorine, bromine, or fluorine.

In some implementations, the organic layer formed on the sidewall of the initial pattern layer has a thickness from 0.5 nanometers to 5 nanometers.

In some implementations, the organic layer is removed using an anisotropic physical etching process.

In some implementations, the anisotropic physical etching process includes a plasma ribbon beam etching process.

In some implementations, the organic layer is removed using the plasma ribbon beam etching process, where a process parameter for performing the plasma ribbon beam etching process on the organic layer includes the following: an included angle between an incidence direction of an etching ion and a normal of a surface of the base is greater than 10° and less than 45°, the etching ion including at least one of He, Ar, Ne, Kr, or Xe, a bias voltage is 50 V to 1000 V, and a chamber pressure is 5 mTorr to 1000 mTorr.

In some implementations, in the step of the atomic layer etching processing, before the organic layer is removed, duration in which the organic layer is located on the sidewall of the initial pattern layer is 0.1 second to 10 seconds.

In some implementations, in the step of performing atomic layer etching processing on the sidewall of the initial pattern layer one or more times to form the pattern layer, the sidewall of the pattern layer has a roughness less than 0.5 nanometers.

In some implementations, in the step of forming the organic layer on the sidewall of the initial pattern layer, the organic layer is further formed on a top surface of the initial pattern layer, the organic layer located on the top surface of the initial pattern layer having a first thickness, and the organic layer located on the sidewall of the initial pattern layer having a second thickness, wherein the second thickness is less than the first thickness.

In some implementations, the first thickness is 5 nanometers to 50 nanometers greater than the second thickness.

In some implementations, the step of forming the organic layer includes: forming an organic material layer on the initial pattern layer and on a base between the initial pattern layers; and etching the organic material layer on the sidewall of the initial pattern layer using an anisotropic etching process to form the organic layer.

In some implementations, during etching of the organic material layer using the anisotropic etching process, an included angle between an incidence direction of an etching ion and a normal of a surface of the base is greater than 10° and less than 45°.

In some implementations, during etching of the organic material layer using the anisotropic etching process, the etching ion includes one or more of He, Ar, Ne, Kr, and Xe, a bias voltage is 50 V to 1000 V, and a chamber pressure is 5 mTorr to 1000 mTorr.

In some implementations, the organic material layer is formed using an atomic layer deposition process or a chemical vapor deposition process.

In some implementations, the initial pattern layer is made of a material including one or more of single crystal silicon, amorphous silicon, silicon oxide, and silicon nitride.

In some implementations, the step of forming the initial pattern layer on the base includes: forming an initial pattern material layer on the base; and etching the initial pattern material layer using an anisotropic etching process to form the initial pattern layer.

In some implementations, the pattern layer is a core layer, a fin, or a gate structure.

In some implementations where the pattern layer is a core layer, the method for forming a semiconductor structure further includes: forming a first spacer layer on the sidewall of the pattern layer; removing the pattern layer after the first spacer layer is formed; forming a second spacer layer on a sidewall of the first spacer layer after the pattern layer is removed; removing the first spacer layer after the second spacer layer is formed; and etching the base using the second spacer layer as a mask to form a fin.

In some implementations, a direction perpendicular to the sidewall of the pattern layer is a lateral direction. In the step of forming the pattern layer, the sidewall of the initial pattern layer is laterally etched by 2 nanometers to 10 nanometers.

Compared to the prior art, technical solutions of the embodiments and implementations of the present disclosure have the following advantages:

In embodiments and implementations of the present disclosure, atomic layer etching processing is performed on the sidewall of the initial pattern layer one or more times to form a pattern layer, the step of the atomic layer etching processing including: forming an organic layer on the sidewall of the initial pattern layer. Generally, bond energy between an atom on an outermost surface of the sidewall of the initial pattern layer and an atom at an inner layer is less than bond energy between the atom at the inner layer. The organic layer usually includes a radical, the radical including an element that may react with the sidewall of the initial pattern layer, further reducing the bond energy between the atom on the outermost surface of the sidewall of the initial pattern layer and the atom at the inner layer. During removal of the organic layer, the atom on the outermost surface of the sidewall of the initial pattern layer may be peeled off. In this way, after a plurality of times of atomic layer etching processing, a protruding part on the sidewall of the initial pattern layer is gradually flattened. Therefore, the sidewall of the formed pattern layer has a relatively small roughness, and the sidewall of the pattern layer has a relatively good appearance, so that electrical performance of the semiconductor structure can be improved.

DETAILED DESCRIPTION

Current devices do not have a satisfactory performance. The reason why the device performance is poor is now analyzed in combination with a method for forming a semiconductor structure.

FIG. 1 to FIG. 4 are schematic structural diagrams corresponding to steps in a method for forming a semiconductor structure.

Figure 1:
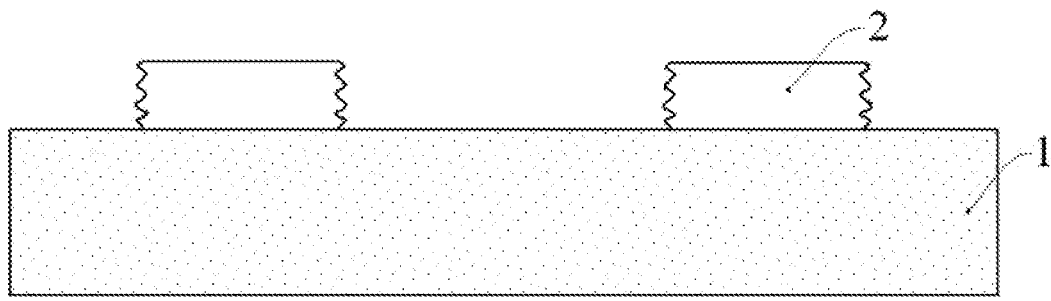
FIG. 1 to FIG. 4 are schematic structural diagrams corresponding to steps in a method for forming a semiconductor structure.

As shown in FIG. 1, a base is provided. The base includes an initial substrate 1 and a core layer 2 located on the initial substrate 1.

Figure 2:
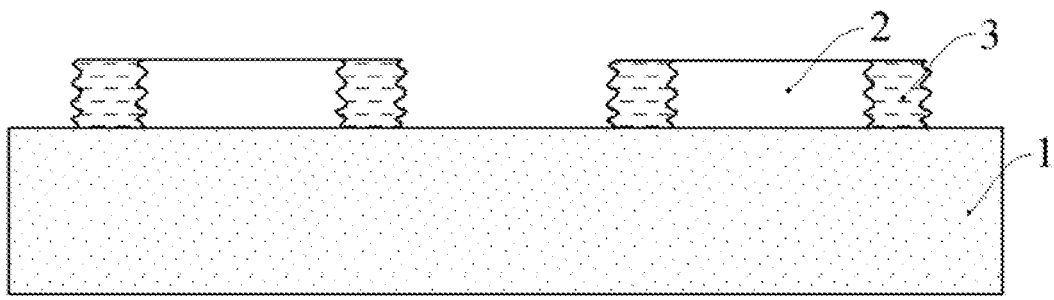

As shown in FIG. 2, a first spacer material layer is conformally covered on the core layer 2 and the initial substrate 1 exposed from the core layer 2. The first spacer material layer on the core layer 2 and on the initial substrate 1 is removed, and a remainder of the first spacer material layer located on a sidewall of the core layer 2 serves as a first spacer layer 3.

Figure 3:
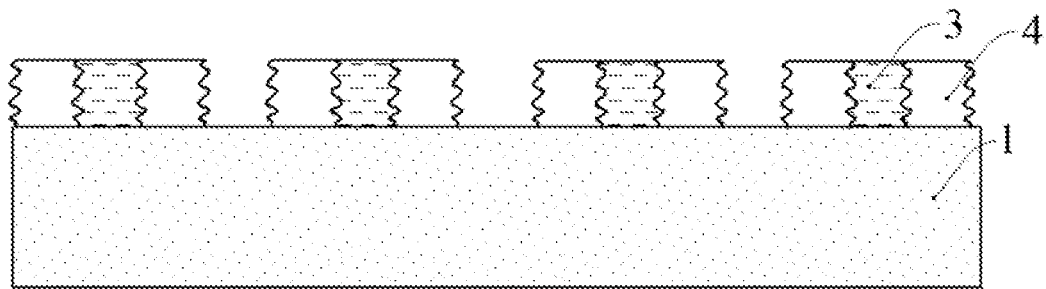

With reference to FIG. 3, after the first spacer layer 3 is formed, the core layer 2 is removed. A second spacer material layer (not shown) is conformally covered on the first spacer layer 3 and the initial substrate 1 exposed from the first spacer layer 3. The second spacer material layer on the first spacer layer 3 and on the initial substrate 1 is removed, and a remainder of the second spacer material layer located on a sidewall of the first spacer layer 3 serves as a second spacer layer 4.

Figure 4:
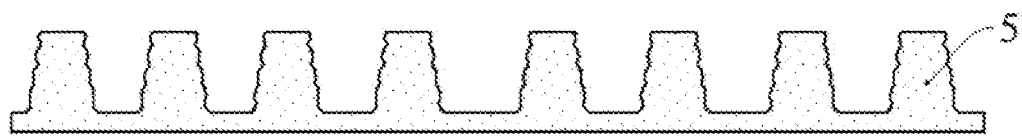

As shown in FIG. 4, the initial substrate 1 is etched using the second spacer layer 4 as a mask to form a fin 5.

It should be noted that the core layer 2 is generally formed using a dry etching process, and the sidewall of the core layer 2 formed using the dry etching process has a specific roughness. In order to not only improve integration of integrated circuits but also increase an operating speed of a device and reduce power consumption of the device, a critical dimension of a semiconductor process becomes increasingly small. Correspondingly, a roughness of the sidewall of the core layer 2 cannot be ignored with respect to a roughness of a sidewall of the finally formed fin 5. Specifically, the sidewall of the core layer 2 has a large roughness, and therefore the sidewall of the first spacer layer 3 formed on the sidewall of the core layer 2 is likely to have a relatively large roughness. The large roughness of the sidewall of the first spacer 3 is likely to result in a relatively large roughness of a sidewall of the second spacer layer 4 formed on the sidewall of the first spacer layer 3, leading to a relatively large roughness of the sidewall of the fin 5 formed through etching of the substrate 1 using the second spacer layer 4 as a mask. An extending direction perpendicular to the sidewall of the fin 5 is used as a lateral direction. Lateral dimensions of parts of the fin 5 are greatly different from each other. In a subsequent process, the fin 5 is used as a channel, and turn-off voltages required for the parts of the channel are different, resulting in a larger possibility of unstable performance of a finally formed device.

To address the foregoing problem, one form of the present disclosure provides a method for forming a semiconductor structure, including: providing a base; forming an initial pattern layer on the base; and performing atomic layer etching processing on a sidewall of the initial pattern layer one or more times to form a pattern layer, where a step of the atomic layer etching processing includes: forming an organic layer on the sidewall of the initial pattern layer; and removing the organic layer.

In some implementations, atomic layer etching processing is performed on the sidewall of the initial pattern layer one or more times to form a pattern layer, where a step of the atomic layer etching processing includes: forming an organic layer on the sidewall of the initial pattern layer. Generally, bond energy between an atom on an outermost surface of the sidewall of the initial pattern layer and an atom at an inner layer is less than bond energy between the atom at the inner layer. The organic layer usually includes a radical, the radical including an element that may react with the sidewall of the initial pattern layer, further reducing the bond energy between the atom on the outermost surface of the sidewall of the initial pattern layer and the atom at the inner layer. During removal of the organic layer, the atom on the outermost surface of the sidewall of the initial pattern layer may be peeled off. In this way, after a plurality of times of atomic layer etching processing, a protruding part on the sidewall of the initial pattern layer is gradually flattened. Therefore, the sidewall of the formed pattern layer has a relatively small roughness, and the sidewall of the pattern layer has a relatively good appearance, so that electrical performance of the semiconductor structure can be improved.

In order to make the foregoing objectives, features, and advantages of embodiments and implementations of the present disclosure more apparent and easier to understand, specific embodiments and implementations of the present disclosure are described in detail below with reference to the accompanying drawings.

FIG. 5 to FIG. 16 are schematic structural diagrams corresponding to steps in one form of a method for forming a semiconductor structure according to the present disclosure.

Figure 5:
FIG. 5 to FIG. 16 are schematic structural diagrams corresponding to steps in one form of a method for forming a semiconductor structure according to the present disclosure.

Referring to FIG. 5, a base 100 is provided.

The base 100 is used for providing a process basis for subsequently forming a semiconductor structure.

In some implementations, the formed semiconductor structure is a fin field effect transistor (FinFET), for example, and the base 100 is configured to form a fin.

In some implementations, the base 100 is made of silicon. In other embodiments and implementations, the base may also be made of germanium, silicon carbide, gallium arsenide, or indium gallium. The base may also be a silicon base on an insulator or a germanium base on an insulator.

Figure 6:
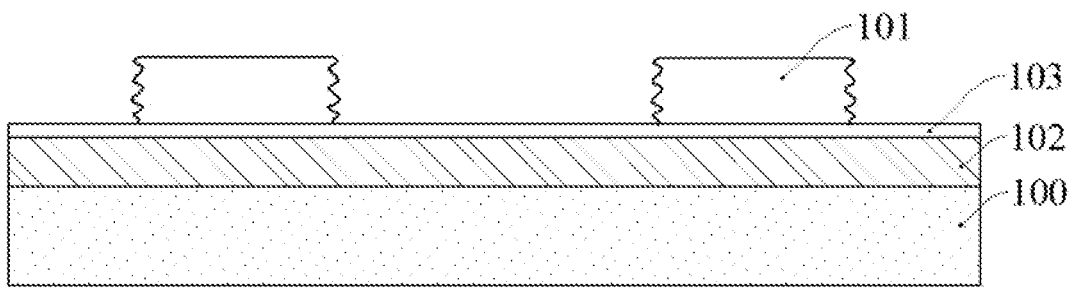

Referring to FIG. 6, an initial pattern layer 101 is formed on the base 100.

The initial pattern layer 101 is configured to prepare for subsequently forming a pattern layer.

Specifically, the initial pattern layer 101 is made of a material including one or more of single crystal silicon, amorphous silicon, silicon oxide, and silicon nitride. In some implementations, the initial pattern layer 101 is made of a material including amorphous silicon.

The step of forming the initial pattern layer 101 on the base 100 includes: forming an initial pattern material layer on the base 100 (not shown); and etching the initial pattern material layer using an anisotropic dry etching process to form the initial pattern layer 101.

The anisotropic dry etching process has a relatively good etching profile control capability, helping the initial pattern layer 101 to have an appearance meeting process requirements. In addition, a sidewall of the initial pattern layer 101 formed using the anisotropic dry etching process has a protruding part. The protruding part on the sidewall of the initial pattern layer 101 may be gradually flattened through atomic layer etching processing subsequently.

The method for forming a semiconductor structure further includes: after the base 100 is provided and before the initial pattern layer 101 is formed, forming a first mask material layer 102 on the base 100 and a second mask material layer 103 located on the first mask material layer 102.

The first mask material layer 102 is used to prepare for subsequent etching to form a first mask layer. The second mask material layer 103 is used to prepare for subsequent etching to form a second mask layer.

During subsequent atomic layer etching of the initial pattern layer 101 to form a pattern layer, a rate at which the initial pattern layer 101 is etched is less than a rate at which the second mask material layer 103 is etched. The second mask material layer 103 can protect the base 100. The first mask material layer 102 and the second mask material layer 103 protect the base 100 against damage.

During subsequent etching of the second mask material layer 103 to form a second mask layer, a rate at which the first mask material layer 102 is etched is less than the rate at which the second mask material layer 103 is etched. The first mask material layer 102 is used as an etch stop layer, helping etch the second mask layers on the first mask material layer 102 at a same rate, thereby helping improve performance uniformity of the semiconductor structure.

In some implementations, the first mask material layer 102 and the second mask material layer 103 are made of different materials. Specifically, the first mask material layer 102 is made of silicon nitride, and the second mask material layer 103 is made of silicon oxide.

Figure 9:
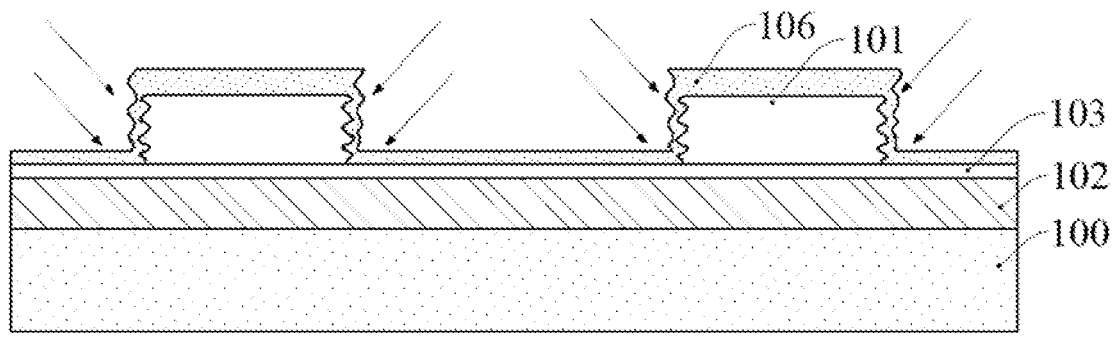
Figure 10:
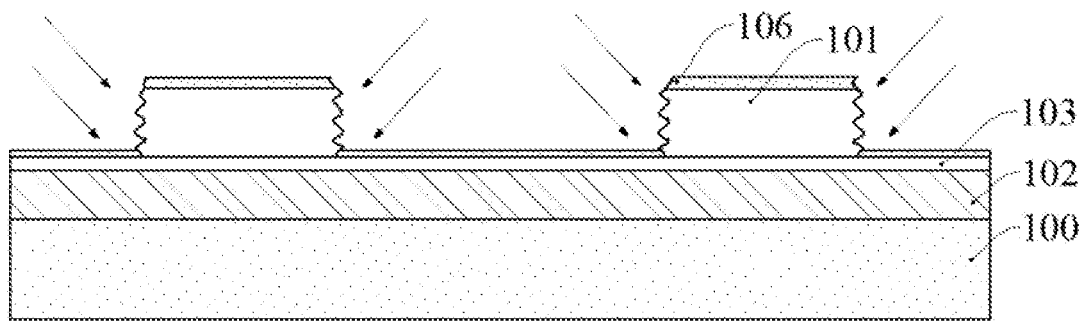
Figure 11:
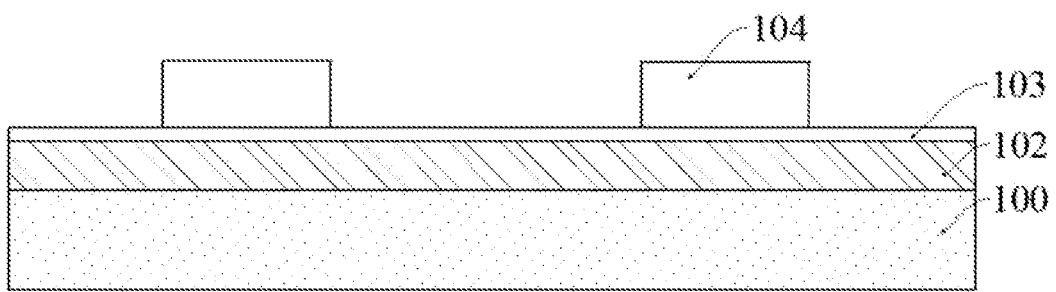

Referring to FIG. 7 to FIG. 11, atomic layer etching (ALE) processing is performed on the sidewall of the initial pattern layer 101 one or more times to form a pattern layer 104 (shown in FIG. 11). A step of the atomic layer etching processing includes: forming an organic layer 105 (shown in FIG. 8) on the sidewall of the initial pattern layer 101; and removing the organic layer 105.

In some implementations of the present disclosure, atomic layer etching processing is performed on the sidewall of the initial pattern layer one or more times to form the pattern layer 104. The step of the atomic layer etching processing includes: forming an organic layer 105 on the sidewall of the initial pattern layer 101. Generally, bond energy between an atom on an outermost surface of the sidewall of the initial pattern layer 101 and an atom at an inner layer is less than bond energy between the atom at the inner layer. The organic layer 105 usually includes a radical, the radical including an element that may react with the sidewall of the initial pattern layer 101, further reducing the bond energy between the atom on the outermost surface of the sidewall of the initial pattern layer 101 and the atom at the inner layer. During removal of the organic layer 105, the atom on the outermost surface of the sidewall of the initial pattern layer 101 may be peeled off. In this way, after a plurality of times of atomic layer etching processing, a protruding part on the sidewall of the initial pattern layer 101 is gradually flattened. Therefore, the sidewall of the formed pattern layer 104 has a relatively small roughness, and the sidewall of the pattern layer 104 has a relatively good appearance, helping form the semiconductor structure subsequently, so that electrical performance of the semiconductor structure can be improved.

Specifically, the step of the atomic layer etching processing includes the following.

Figure 7:
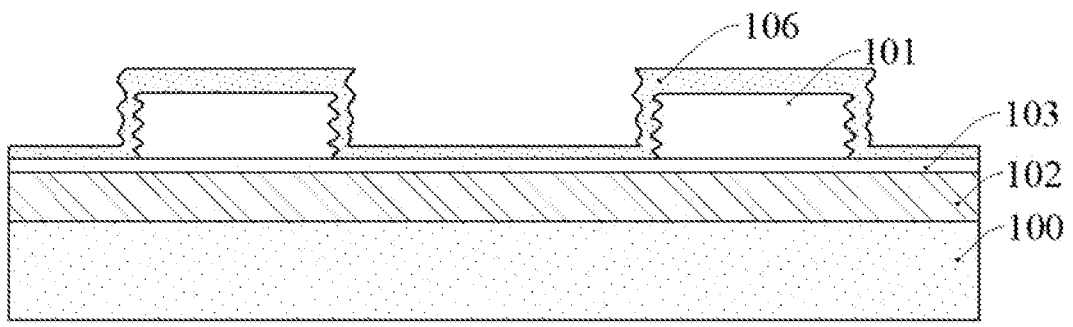
Figure 8:
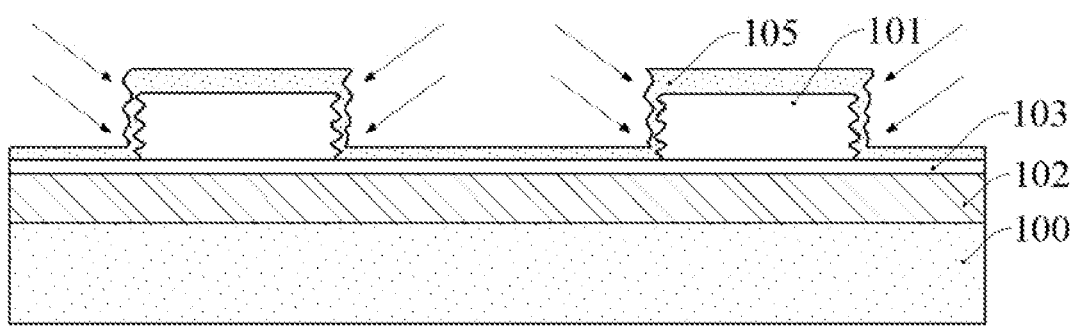

As shown in FIG. 7 and FIG. 8, an organic layer 105 is formed on the sidewall of the initial pattern layer 101 (shown in FIG. 8).

The organic layer 105 may react with the atom on the outermost surface of the sidewall of the initial pattern layer 101, so that the bond energy between the atom on the outermost surface of the sidewall of the initial pattern layer 101 and the atom at the inner layer is further reduced, facilitating peeling off of the atom on the outermost surface of the sidewall of the initial pattern layer 101 during subsequent removal of the organic layer 105. The organic layer 105 has a radical.

In some implementations, the organic layer 105 is made of a material including one or more of chlorine, bromine, and fluorine.

It should be noted that, in the step of forming the organic layer 105 on the sidewall of the initial pattern layer 101, the organic layer 105 is further formed on a top surface of the initial pattern layer 101, the organic layer 105 located on the top surface of the initial pattern layer 101 having a first thickness, and the organic layer 105 located on the sidewall of the initial pattern layer 101 having a second thickness, where the second thickness is less than the first thickness.

The thickness of the organic layer 105 on the sidewall of the initial pattern layer 101 is less than the thickness of the organic layer 105 on the top surface of the initial pattern layer 101, so that subsequent removal of the organic layer 105 on the sidewall of the initial pattern layer 101 spends a short process time, helping improve formation efficiency of the pattern layer 104. In addition, the thickness of the organic layer 105 on the top surface of the initial pattern layer 101 is greater than the thickness of the organic layer 105 on the sidewall of the initial pattern layer 101, so that a thickness of a finally formed pattern layer is equal to a thickness of the initial pattern layer 101 during the atomic layer etching processing. During subsequent pattern transfer according to the pattern layer, a mask layer is formed on the basis of the pattern layer. The mask layer has a sufficient height, helping a formed fin to have a height meeting the process requirements.

The step of forming the organic layer 105 on the sidewall of the initial pattern layer 101 includes the following. As shown in FIG. 7, an organic material layer 106 is formed on the initial pattern layer 101 and on the base 100 between the initial pattern layers 101; and as shown in FIG. 8, the organic material layer 106 on the sidewall of the initial pattern layer 101 is etched using an anisotropic etching process to form the organic layer 105.

In some implementations, the organic material layer 106 is formed using an atomic layer deposition (ALD) process. The atomic layer deposition process includes a plurality of atomic layer deposition cycles, helping the formed organic material layer 106 to be free of a void. Accordingly, a void is unlikely to exist in the subsequently formed organic layer, so that all atoms on the outermost surface of the sidewall of the initial pattern layer 101 can be in contact with the organic material layer 106, thereby reducing the bond energy between the atom on the outermost surface of the sidewall of the initial pattern layer 101 and the atom at the inner layer. During subsequent removal of the organic layer on the sidewall of the initial pattern layer 101, the atom on the outermost surface of the sidewall of the initial pattern layer 101 can be peeled off. In other embodiments, the organic material layer may also be formed using a chemical vapor deposition (CVD) process.

In some implementations, the anisotropic etching process is performed using a plasma ribbon beam etching process. An etching ion in the plasma ribbon beam etching process does not select a to-be-etched material and has good etching directionality. In other embodiments and implementations, the anisotropic etching process may also be performed using a reactive ion etching process.

During etching of the organic material layer 106 using the anisotropic etching process, the etching ion includes one or more of He, Ar, Ne, Kr, and Xe, He, Ar, Ne, Kr, and Xe are all inert ions, so that during the etching of the organic material layer 106, the etching ion is unlikely to react with a material of the sidewall of the initial pattern layer 101.

It should be noted that, during the etching of the organic material layer 106 using the anisotropic etching process, a bias voltage should be neither excessively large nor excessively small. If the bias voltage is excessively large, the organic material layer 106 is etched at an excessively high rate, and process controllability and reaction rate uniformity are low during the etching, which is likely to cause damage to the sidewall of the initial pattern layer 101. As a result, the roughness of the sidewall of the formed pattern layer 104 is not significantly reduced after a plurality of times of atomic layer etching processing. If the bias voltage is excessively small, the organic material layer 106 is likely to be etched at an excessively low rate, impeding improvement of formation efficiency of the organic layer 105. In some implementations, during the etching of the organic material layer 106 using the anisotropic etching process, the bias voltage is 50 V to 1000 V.

It should be noted that, during the etching of the organic material layer 106 using the anisotropic etching process, a chamber pressure should be neither excessively large nor excessively small. If the chamber pressure is excessively large, the etching ion is likely to have a relatively small speed and does not have anisotropy, which is likely to cause relatively large etching on the organic material layer 106 on the top wall of the initial pattern layer 101, leading to a relatively small thickness of the organic layer 105 on the top surface of the initial pattern layer 101. During subsequent removal of the organic layer 105 on the sidewall of the initial pattern layer 101, the top surface of the initial pattern layer 101 is likely to be etched, resulting in a reduced height of the finally formed pattern layer. During subsequent pattern transfer according to the pattern layer, a mask layer is formed based on the pattern layer. The mask layer has an insufficient height, resulting in a smaller height of the formed fin. If the chamber pressure is excessively small, the organic material layer 106 on the sidewall of the initial pattern layer 101 is etched at a relatively high rate, and process controllability and reaction rate uniformity are low during the etching, which is likely to cause damage to the sidewall of the initial pattern layer 101. As a result, the roughness of the sidewall of the pattern layer 104 is not significantly reduced after atomic layer etching processing, impeding improvement of electrical performance of the semiconductor structure. In some implementations, during the etching of the organic material layer 106 using the anisotropic etching process, the chamber pressure is 5 mTorr to 1000 mTorr.

It should be noted that, during etching of the organic material layer 106 using the anisotropic etching process, an included angle between an incidence direction of the etching ion and a normal of a surface of the base 100 should be neither excessively large nor excessively small. During etching of the organic material layer 106 using the anisotropic etching process, if the included angle between the incident direction of the etching ion and the normal of the surface of the base 100 is excessively small, during etching of the organic material layer 106, the rate at which the etching ion etches the organic material layer 106 on the top surface of the initial pattern layer 101 is correspondingly greater than the rate at which the organic material layer 106 on the sidewall of the initial pattern layer 101 is etched. As a result, the thickness of the organic layer 105 on the sidewall of the initial pattern layer 101 is greater than the thickness of the organic layer 105 on the top wall of the initial pattern layer 101. During subsequent removal of the organic layer 105 on the sidewall of the initial pattern layer 101, the organic layer 105 on the top surface of the initial pattern layer 101 is likely to be removed prematurely, and the top surface of the initial pattern layer 101 is likely to be damaged, resulting in a reduced height of the final formed pattern layer. During pattern transfer according to the pattern layer, a mask layer is formed on the basis of the pattern layer. The mask layer has insufficient height, resulting in a relatively small height of a formed fin. During etching of the organic material layer 106 using the anisotropic etching process, if the included angle between the incident direction of the etching ion and the normal of the surface of the base 100 is excessively large, a shadow effect is likely to occur, impeding etching of the organic material layer 106 at the bottom of the sidewall of the initial pattern layer 101. As a result, during subsequent atomic layer etching processing, an atom on an outermost surface of the bottom of the sidewall of the initial pattern layer 101 cannot be peeled off successfully, and the roughness of the bottom of the sidewall of the initial pattern layer 101 cannot be reduced. In some implementations, during etching of the organic material layer 106 using the anisotropic etching process, the included angle between the incidence direction of the etching ion and the normal of the surface of the base 100 is greater than 10° and less than 45°, for example, 20° or 30°.

It should be noted that, in the step of forming the organic layer 105, the first thickness should be larger than the second thickness neither by an excessively large amount nor an excessively small amount. If the first thickness is larger than the second thickness by an excessively large amount, the thickness of the organic layer 105 on the top surface of the initial pattern layer 101 is excessively large after a plurality of times of atomic layer etching processing, which is likely to impose excessively large pressure on the initial pattern layer 101. Corresponding, the finally formed pattern layer is bent or deformed, and the fin subsequently formed through pattern transfer according to the pattern layer has poor quality, resulting in poor electrical performance of the semiconductor structure. If the first thickness is larger than the second thickness by an excessively small amount, during subsequent removal of the organic layer 105 on the sidewall of the initial pattern layer 101, the organic layer 105 on the top surface of the initial pattern layer 101 is likely to be removed, and the top surface of the initial pattern layer 101 is likely to be damaged, resulting in a reduced height of the finally formed pattern layer. During subsequent pattern transfer according to the pattern layer, a mask layer is formed based on the pattern layer. The mask layer has an insufficient height, resulting in a relatively small height of the formed fin. In some implementations, the thickness of the organic layer 105 on the top surface of the initial pattern layer 101 is 5 nanometers to 50 nanometers greater than the thickness of the organic layer 105 on the sidewall of the initial pattern layer 101.

It should be noted that the organic layer 105 on the sidewall of the initial pattern layer 101 should be neither excessively thick nor excessively thin. If the organic layer 105 on the sidewall of the initial pattern layer 101 is excessively thick, the subsequent removal of the organic layer 105 on the sidewall of the initial pattern layer 101 spends an excessively long process time, resulting in excessively low formation efficiency. If the organic layer 105 on the sidewall of the initial pattern layer 101 is excessively thin, the organic layer 105 on the sidewall of the initial pattern layer 101 cannot reduce the bond energy between the atom on the outermost surface of the sidewall of the initial pattern layer 101 and the atom at the inner layer, and the roughness of the sidewall of the pattern formed layer is not significantly reduced after a plurality of times of atomic layer etching processing. In some implementations, the organic layer 105 formed on the sidewall of the initial pattern layer 101 has a thickness from 0.5 nanometers to 5 nanometers.

As shown in FIG. 9 and FIG. 10, the step of the atomic layer etching processing further includes: removing the organic layer 105.

Specifically, removing the organic layer 105 means to remove the organic layer 105 on the sidewall of the initial pattern layer 101.

Removing the organic layer 105 can peel off the atom on the outermost surface of the sidewall of the initial pattern layer 101.

In some implementations, the organic layer 105 is removed using an anisotropic physical etching process. Generally, the anisotropic physical etching process can provide an etching ion with energy, and the etching ion is an inert ion. Inert ion bombardment can physically remove the organic layer 105, and does not react with the material of the sidewall of the initial pattern layer 101 chemically, so that the sidewall of the initial pattern layer 101 has a relatively small roughness.

In some implementations, the anisotropic physical etching process includes a plasma ribbon beam etching process. An etching ion in the plasma ribbon beam etching process does not select a to-be-etched material and has good etching directionality.

Specifically, during removal of the organic layer 105 using the plasma ribbon beam etching process, the etching ion includes one or more of He, Ar, Ne, Kr, and Xe. Each of He, Ar, Ne, Kr, and Xe are inert ions, so that after the organic layer 105 on the sidewall of the initial pattern layer 101 is removed, the etching ion is unlikely to react with the material of the sidewall of the initial pattern layer 101, impeding reduction of the roughness of the sidewall of the finally formed pattern layer.

It should be noted that, during removal of the organic layer 105 on the sidewall of the initial pattern layer 101 using the plasma ribbon beam etching process, the chamber pressure should not be neither excessively large nor excessively small. If the chamber pressure is excessively large, the etching ion is likely to have a relatively small speed and does not have anisotropy, which is likely to cause relatively large etching on the organic layer 105 on the top surface of the initial pattern layer 101. The top surface of the initial pattern layer 101 is likely to be damaged, resulting in a reduced height of the finally formed pattern layer 104. During subsequent pattern transfer according to the pattern layer 104, a mask layer is formed based on the pattern layer 104. The mask layer has an insufficient height, resulting in a smaller height of the formed fin. If the chamber pressure is excessively small, the organic layer 105 on the sidewall of the initial pattern layer 101 is etched at a relatively high rate, and process controllability and reaction rate uniformity are low during the etching, and therefore the sidewall of the initial pattern layer 101 is likely to be damaged. The roughness of the sidewall of the initial pattern layer 101 is not significantly reduced after atomic layer etching processing, impeding improvement of electrical performance of the semiconductor structure. In some implementations, during removal of the organic layer 105 using the plasma ribbon beam etching process, the chamber pressure is 5 mTorr to 1000 mTorr.

It should be noted that, during removal of the organic layer 105 on the sidewall of the initial pattern layer 101 using the plasma ribbon beam etching process, the bias voltage should not be neither excessively large nor excessively small. If the bias voltage is excessively large, the organic layer 105 on the sidewall of the initial pattern layer 101 is etched at an excessively high rate, and process controllability and reaction rate uniformity are low during the etching, and therefore the sidewall of the initial pattern layer 101 is likely to be damaged. The roughness of the sidewall of the formed pattern layer 104 is not significantly reduced after a plurality of times of atomic layer etching processing. If the bias voltage is excessively small, the organic layer 105 on the sidewall of the initial pattern layer 101 is likely to be etched at an excessively low rate, impeding improvement of the formation efficiency of the pattern layer 104. In some implementations, during removal of the organic layer 105 using the plasma ribbon beam etching process, the bias voltage is 50 V to 1000 V.

It should be noted that, during removal of the organic layer 105 on the sidewall of the initial pattern layer 101 using the plasma ribbon beam etching process, the included angle between the incident direction of the etching ion and the normal of the surface of the base 100 should not be neither excessively large nor excessively small. If the included angle between the incident direction of the etching ion and the normal of the surface of the base 100 is excessively small, during etching of the organic layer 105 on the sidewall of the initial pattern layer 101, the rate at which the etching ion etches the organic layer 105 on the top surface of the initial pattern layer 101 is correspondingly greater than the rate at which the organic layer 105 on the sidewall of the initial pattern layer 101 is etched. The organic layer 105 on the top surface of the initial pattern layer 101 is likely to be removed prematurely, and the top surface of the initial pattern layer 101 is likely to be damaged, resulting in a reduced height of the final formed pattern layer 104. During subsequent pattern transfer according to the pattern layer 104, a mask layer is formed on the basis of the pattern layer 104. The mask layer has insufficient height, resulting in a relatively small height of the formed fin. If the included angle between the incident direction of the etching ion and the normal of the surface of the base 100 is excessively large, a shadow effect is likely to occur, impeding etching of the organic layer 105 at the bottom of the sidewall of the initial pattern layer 101. Correspondingly, the atom on the outermost surface of the bottom of the sidewall of the initial pattern layer 101 cannot be peeled off successfully, and the roughness of the bottom of the sidewall of the initial pattern layer 101 cannot be reduced. In some implementations, during removal of the organic layer 105 on the sidewall of the initial pattern layer 101 using the plasma ribbon beam etching process, the included angle between the incidence direction of the etching ion and the normal of the surface of the base 100 is greater than 10° and less than 45°, for example, 20° or 30°.

It should be noted that, in the step of the atomic layer etching processing, before the organic layer 105 is removed, duration in which the organic layer 105 is located on the sidewall of the initial pattern layer 101 should be neither excessively long nor excessively short. If the duration is excessively short, the chlorine, the bromine, or the fluorine in the organic layer 105 cannot reduce the bond energy between the atom on the outermost surface of the sidewall of the initial pattern layer 101 and the atom on the inner layer. During removal of the organic layer 105 on the sidewall of the initial pattern layer 101, the atom on the outermost surface of the sidewall of the initial pattern layer 101 cannot be easily removed. Accordingly, the roughness of the sidewall of the initial pattern layer 101 cannot be reduced through the atomic layer etching processing. If the duration is excessively too long, a process time spent by the atomic layer etching processing cannot be reduced. Accordingly, the formation efficiency of the pattern layer 104 cannot be improved. In some implementations, in the step of the atomic layer etching processing, before the organic layer 105 is removed, duration in which the organic layer 105 is located on the sidewall of the initial pattern layer 101 is 0.1 second to 10 seconds.

It should be noted that the duration in which the organic layer 105 is located on the sidewall of the initial pattern layer 101 is duration from formation of the organic material layer 106 to removal of the organic layer 105 on the sidewall of the initial pattern layer 101.

As shown in FIG. 11, atomic layer etching processing is performed on the sidewall of the initial pattern layer 101 one or more times to form the pattern layer 104.

The pattern layer 104 provides a process basis for subsequently forming a first spacer layer on the sidewall of the pattern layer 104.

In some implementations, the pattern layer 104 is a core layer. In other embodiments and implementations, the pattern layer may be a fin or a gate structure.

It should be noted that, in the step of forming the pattern layer 104, the roughness of the sidewall of the pattern layer 104 should not be excessively large. If the roughness of the sidewall of the pattern layer 104 is excessively large, the sidewall of the fin formed through pattern transfer according to the pattern layer 104 in a subsequent process has a relatively large roughness, resulting in poor electrical performance of the semiconductor structure. In some implementations, in the step of performing atomic layer etching processing on the sidewall of the initial pattern layer 101 one or more times to form the pattern layer 104, the sidewall of the pattern layer 104 has a roughness less than 0.5 nanometers.

A direction perpendicular to the sidewall of the pattern layer 104 is used as a lateral direction. In the step of removing the organic layer 105 on the sidewall of the initial pattern layer 101, the atom on the outermost surface of the sidewall of the initial pattern layer 101 is removed. Therefore, after a plurality of times of atomic layer etching processing, a lateral dimension of the formed pattern layer 104 is less than a lateral dimension of the initial pattern layer 101.

It should be noted that, in the step of forming the pattern layer 104, a dimension by which the sidewall of the initial pattern layer 101 is laterally etched should be neither excessively large nor excessively small. In the step of forming the pattern layer 104, if the dimension by which the sidewall of the initial pattern layer 101 is laterally etched is excessively large, atomic layer etching processing is performed excessive times accordingly. As a result, forming the pattern layer 104 spends an excessively long time, and the formed pattern layer 104 has an excessively small lateral dimension, failing to meet the process requirements. In the step of forming the pattern layer 104, if the dimension by which the sidewall of the initial pattern layer 101 is laterally etched is excessively small, atomic layer etching processing is performed insufficient times accordingly. As a result, the roughness of the sidewall of the pattern layer 104 is unlikely to be significantly reduced, and the sidewall of the fin subsequently formed through the pattern transfer according to the pattern layer 104 still has a relatively large roughness, resulting in poor electrical performance of the semiconductor structure. In some implementations, in the step of forming the pattern layer 104, the sidewall of the initial pattern layer 101 is laterally etched by 2 nanometers to 10 nanometers.

Figure 12:
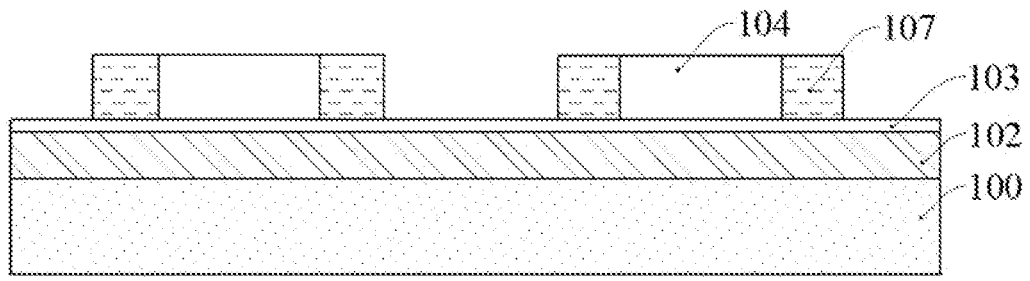

Referring to FIG. 12, the method for forming a semiconductor structure further includes: forming a first spacer layer 107 on the sidewall of the pattern layer 104.

The first spacer layer 107 is configured to provide a process basis for subsequently forming a second spacer layer.

The first spacer layer 107 is formed on the basis of the pattern layer 104. Because the roughness of the sidewall of the pattern layer 104 is relatively small, a roughness of a sidewall of the formed first spacer layer 107 is relatively small.

Specifically, the first spacer layer 107 is made of a material including one or more of silicon oxide, silicon nitride, and silicon oxynitride. In some implementations, the first spacer layer 107 is made of a material including silicon oxide. Silicon oxide is frequently used in a process and has high process compatibility, helping reduce process difficulty and process costs of forming the first spacer layer 107.

The step of forming the first spacer layer 107 includes: A first spacer material layer (not shown) is conformally covered the pattern layer 104 and on the base 100 between the pattern layers 104, and the first spacer material layer on the top surface of the pattern layer 104 and on the base 100 is removed. A remainder of the first spacer material layer located on the sidewall of the pattern layer 104 serves as the first spacer layer 107.

In some implementations, the first spacer material layer is formed using an atomic layer deposition process. The atomic layer deposition process includes a plurality of atomic layer deposition cycles, helping improve thickness uniformity of the first spacer material layer, so that the first spacer material layer can be conformally covered on the sidewall of the pattern layer 104, on the top surface of the pattern layer 104, and on the base 100 between the pattern layers 104. In addition, the atomic layer deposition process has good gap filling performance and step coverage. In other embodiments and implementations, the first spacer layer may also be formed using a chemical vapor deposition process.

Figure 13:
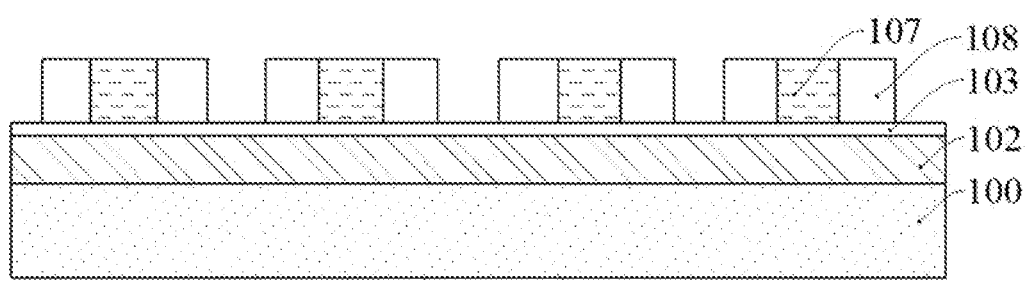

Referring to FIG. 13, the method for forming a semiconductor structure further includes: removing the pattern layer 104 after the first spacer layer 107 is formed; and forming a second spacer layer 108 on a sidewall of the first spacer layer 107 after the pattern layer 104 is removed.

The pattern layer 104 is removed to prepare for subsequently forming the second spacer layer 108 using the first spacer layer 107 as a process basis.

The second spacer layer 108 is formed using the first spacer layer 107 as a process basis. Because the roughness of the sidewall of the first spacer layer 107 is relatively small, a roughness of a sidewall of the formed second spacer layer 108 is relatively small.

In some implementations, the pattern layer 104 is removed using a wet etching process. The wet etching process has a high etching rate, and is simple in operation, and has low process costs.

In some implementations, the pattern layer 104 is made of a material including amorphous silicon. A corresponding etching solution for removing the pattern layer 104 is a tetrafluorenyl ammonium hydroxide (TMAH) solution.

The second spacer layer 108 serves as an etching mask for subsequently etching the base 100.

Specifically, the second spacer layer 108 is made of a material including one or more of silicon oxide, silicon nitride, and silicon oxynitride. In some implementations, the second spacer layer 108 is made of a material including silicon nitride.

The step of forming the second spacer layer 108 includes: conformally covering a second spacer material layer (not shown) on the first spacer layer 107 and on the base 100 between the first spacer layers 107; and removing the second spacer material layer on the top surface of the first spacer layer 107 and on the base 100, a remainder of the second spacer material layer located on the sidewall of the first spacer layer 107 serving as the second spacer layer 108.

In some implementations, the second spacer material layer is formed using an atomic layer deposition process. The atomic layer deposition process includes a plurality of atomic layer deposition cycles, helping improve thickness uniformity of the second spacer material layer, so that the second spacer material layer can be conformally covered on the sidewall of the first spacer layer 107, on the top surface of the first spacer layer 107, and on the base 100 between the first spacer layers 107. In addition, the atomic layer deposition process has good gap filling performance and step coverage. In other embodiments and implementations, the second spacer layer may also be formed using a chemical vapor deposition process.

Figure 14:
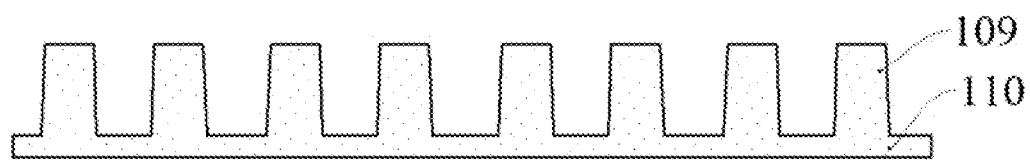

Referring to FIG. 14, the method for forming a semiconductor structure further includes: removing the first spacer layer 107 after the second spacer layer 108 is formed; and etching the base 100 using the second spacer layer 108 as a mask to form a fin 109.

It should be noted that during formation of the fin 109, a remainder of the base is used as the substrate 110, and the fin 109 is located on the substrate 110.

The fin 109 is formed using the second pacer layer 108 as a process basis, and a sidewall of the second spacer layer 108 has a relatively small roughness. Therefore, a sidewall of the formed fin 109 has a relatively small roughness.

In some implementations, the base 100 is etched using the second spacer layer 108 as a mask and a dry etching process to form a fin 109.

The dry etching process has an anisotropic etching characteristic and a relatively good etching profile control capability, helping the fin 109 to have an appearance meeting the process requirements and accurately control a formation height of the fin 109. In addition, the base 100 is etched using the dry etching process. A first mask material layer 102, a second mask material layer 103, and the base 100 may be etched in a same etching device using changed etching gases, simplifying a process step.

It should be noted that, in the step of forming the fin 109, the first mask material layer 102 and the second mask material layer 103 are also etched to form a first mask layer (not shown) and a second mask layer (not shown). A rate at which the first mask material layer 102 is etched is less than a rate at which the second mask material layer 103 is etched. Therefore, during etching of the second mask material layer 103 to form the second mask layer, all second mask material layers 103 on the first mask material layer 102 are etched at a same rate, helping form the second mask layers on the base 100 at a same rate, and correspondingly, helping the formed fin 109 to have relatively good height uniformity.

It should be noted that, the method for forming a semiconductor structure further includes: after the fin 109 is formed, removing the first mask layer and the second mask layer to prepare for subsequently forming a gate structure.

Figure 15:
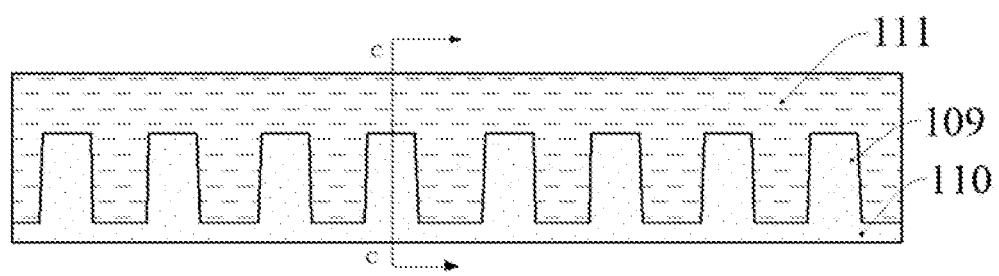
Figure 16:
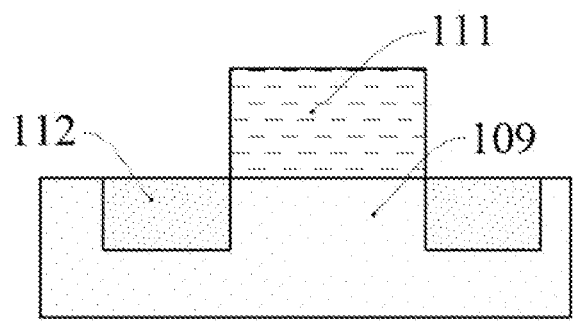

Referring to FIG. 15 and FIG. 16, FIG. 16 is a cross-sectional view of FIG. 15 in a direction CC. The method for forming a semiconductor structure further includes: forming a gate structure 111 spanning the fin 109, and forming a source-drain doped layer 112 within the fin 109 on two sides of the gate structure 111.

The roughness of the sidewall of the fin 109 is relatively small. In a direction perpendicular to an extending direction of the fin 109 as a lateral direction, a lateral dimension difference among parts of the fin 109 is relatively small. During the operation of the semiconductor structure, the fin 109 is used as a channel, and correspondingly a difference between a turn-on voltage at the top of the channel and a turn-on voltage at the bottom of the channel is relatively small, so that the semiconductor structure is likely to have stable performance.

During operation of the semiconductor structure, the gate structure 111 is configured to control turn-on and turn-off of the channel.

During operation of the semiconductor structure, the source-drain doped layer 112 provides stress for the channel to improve carrier mobility.

The transistor includes: a substrate 110; a fin 109 located on the substrate 110, where the gate structure 111 spans the fin 109 and covers a part of the top of and a part of a sidewall of the fin 109; and a source-drain doped layer 112 located within the fin 109 on two sides of the gate structure 111.

The roughness of the sidewall of the fin 109 is relatively small. In a direction perpendicular to an extending direction of the fin 109 as a lateral direction, a lateral dimension difference among parts of the fin 109 is relatively small. During the operation of the semiconductor structure, the fin 109 is used as a channel, and a difference between a turn-on voltage at the top of the channel and a turn-on voltage at the bottom of the channel is relatively small, so that the semiconductor structure is likely to have stable performance.

During operation of the semiconductor structure, the gate structure 111 is configured to control turn-on and turn-off of the channel.

During operation of the semiconductor structure, the source-drain doped layer 112 provides stress for the channel to improve carrier mobility.

The semiconductor structure described above may be formed using the forming method in the foregoing embodiments and implementations, or may be formed using other forming methods. For detailed descriptions of the semiconductor structure, refer to the corresponding descriptions in the foregoing embodiments and implementations, as the details are not described again.

Although the present disclosure is described as above, the present disclosure is not limited thereto. A person skilled in the art may make variations and modifications without departing from the spirit and scope of the present disclosure. Therefore, the protection scope of the present disclosure should be subject to the claims.

What is claimed is:

1. A method for forming a semiconductor structure, comprising:
   providing a base;
   forming an initial pattern layer on the base; and
   performing atomic layer etching processing on a sidewall of the initial pattern layer one or more times to form a pattern layer;
   wherein a step of the atomic layer etching processing comprises:
      forming an organic material layer on the initial pattern layer and on a base between the initial pattern layers;
      etching the organic material layer on the sidewall of the initial pattern layer using an anisotropic etching process to form an organic layer; and
      removing the organic layer.

2. The method for forming a semiconductor structure according to claim 1, wherein the organic layer is made of a material comprising at least one of chlorine, bromine, or fluorine.

3. The method for forming a semiconductor structure according to claim 1, wherein the organic layer formed on the sidewall of the initial pattern layer has a thickness from 0.5 nanometers to 5 nanometers.

4. The method for forming a semiconductor structure according to claim 1, wherein the organic layer is removed using an anisotropic physical etching process.

5. The method for forming a semiconductor structure according to claim 4, wherein the anisotropic physical etching process comprises a plasma ribbon beam etching process.

6. The method for forming a semiconductor structure according to claim 1, wherein:
   the organic layer is removed using a plasma ribbon beam etching process, and
   a process parameter for performing the plasma ribbon beam etching process on the organic layer comprises:
      an included angle between an incidence direction of an etching ion and a normal of a surface of the base is greater than 10° and less than 45°,
      the etching ion comprising at least one of He, Ar, Ne, Kr, or Xe,
      a bias voltage is 50 V to 1000 V, and
      a chamber pressure is 5 mTorr to 1000 mTorr.

7. The method for forming a semiconductor structure according to claim 1, wherein in the step of the atomic layer etching processing, before the organic layer is removed, a duration in which the organic layer is located on the sidewall of the initial pattern layer is 0.1 second to 10 seconds.

8. The method for forming a semiconductor structure according to claim 1, wherein in the step of performing atomic layer etching processing on the sidewall of the initial pattern layer one or more times to form the pattern layer, the sidewall of the pattern layer has a roughness less than 0.5 nanometers.

9. The method for forming a semiconductor structure according to claim 1, wherein:
   in the step of forming the organic layer on the sidewall of the initial pattern layer, the organic layer is further formed on a top surface of the initial pattern layer,
   the organic layer located on the top surface of the initial pattern layer has a first thickness, and
   the organic layer located on the sidewall of the initial pattern layer has a second thickness, where the second thickness is less than the first thickness.

10. The method for forming a semiconductor structure according to claim 9, wherein the first thickness is 5 nanometers to 50 nanometers greater than the second thickness.

11. The method for forming a semiconductor structure according to claim 1, wherein during etching of the organic material layer using the anisotropic etching process, an included angle between an incidence direction of an etching ion and a normal of a surface of the base is greater than 10° and less than 45°.

12. The method for forming a semiconductor structure according to claim 1, wherein during etching of the organic material layer using the anisotropic etching process, the etching ion comprises at least one of He, Ar, Ne, Kr, or Xe, a bias voltage is 50 V to 1000 V, and a chamber pressure is 5 mTorr to 1000 mTorr.

13. The method for forming a semiconductor structure according to claim 1, wherein the organic material layer is formed using an atomic layer deposition process or a chemical vapor deposition process.

14. The method for forming a semiconductor structure according to claim 1, wherein the initial pattern layer is made of a material comprising at least one of a single crystal silicon, amorphous silicon, silicon oxide, or silicon nitride.

15. The method for forming a semiconductor structure according to claim 1, wherein the step of forming the initial pattern layer on the base comprises:

forming an initial pattern material layer on the base; and etching the initial pattern material layer using an anisotropic etching process to form the initial pattern layer.

16. The method for forming a semiconductor structure according to claim 1, wherein the pattern layer is a core layer, a fin, or a gate structure.

17. The method for forming a semiconductor structure according to claim 1, wherein:

the pattern layer is a core layer; and the method for forming a semiconductor structure further comprises:

forming a first spacer layer on the sidewall of the pattern layer;

removing the pattern layer after the first spacer layer is formed;

forming a second spacer layer on a sidewall of the first spacer layer after the pattern layer is removed;

removing the first spacer layer after the second spacer layer is formed; and etching the base using the second spacer layer as a mask to form a fin.

18. The method for forming a semiconductor structure according to claim 1, wherein:

a direction perpendicular to the sidewall of the pattern layer is a lateral direction; and in the step of forming the pattern layer, the sidewall of the initial pattern layer is laterally etched by 2 nanometers to 10 nanometers.

* * * * *